United States Patent
Hung

(10) Patent No.: US 10,247,756 B2
(45) Date of Patent: Apr. 2, 2019

(54) PROBE CARD STRUCTURE

(71) Applicant: Hermes-Epitek Corp., Taipei (TW)

(72) Inventor: Chien-Yao Hung, Hsin-Chu (TW)

(73) Assignee: Hermes-Epitek Corp., Taipei (TW)

( * ) Notice: Subject to any disclaimer, the term of this patent is extended or adjusted under 35 U.S.C. 154(b) by 315 days.

(21) Appl. No.: 15/195,130

(22) Filed: Jun. 28, 2016

(65) Prior Publication Data

US 2016/0305982 A1 Oct. 20, 2016

Related U.S. Application Data

(63) Continuation-in-part of application No. 14/717,240, filed on May 20, 2015, now Pat. No. 9,408,293.

(30) Foreign Application Priority Data

May 20, 2014 (TW) .............................. 103117591 A

(51) Int. Cl.
| | | |
|---|---|---|
| G01R 1/073 | (2006.01) | |
| G01R 31/28 | (2006.01) | |
| G01R 1/067 | (2006.01) | |
| H05K 1/14 | (2006.01) | |

(52) U.S. Cl.
CPC ......... *G01R 1/07342* (2013.01); *G01R 1/067* (2013.01); *G01R 31/2834* (2013.01); *G01R 31/2886* (2013.01); *H05K 1/142* (2013.01); *H05K 2203/049* (2013.01)

(58) Field of Classification Search
None
See application file for complete search history.

(56) References Cited

U.S. PATENT DOCUMENTS

| | | | | |
|---|---|---|---|---|
| 7,724,004 B2* | 5/2010 | Eldridge | ............ | G01R 31/2889 324/750.27 |
| 7,898,272 B2* | 3/2011 | Sasaki | ................ | G01R 31/2889 324/754.07 |
| 2005/0012513 A1* | 1/2005 | Cheng | ................ | G01R 1/07342 324/755.05 |
| 2006/0125501 A1* | 6/2006 | Liu | .................... | G01R 31/2889 324/750.25 |
| 2007/0182431 A1 | 8/2007 | Komatsu | | |
| 2011/0043239 A1 | 2/2011 | Tomita | | |
| 2011/0234251 A1 | 9/2011 | Komatsu | | |
| 2013/0187676 A1 | 7/2013 | Washio | | |

* cited by examiner

*Primary Examiner* — Melissa J Koval
*Assistant Examiner* — Nasima Monsur
(74) *Attorney, Agent, or Firm* — Muncy, Geissler, Olds & Lowe, P.C.

(57) ABSTRACT

The invention relates to a probe card structure, which comprises printed circuit board structure with a first through hole, a center stiffener with a second through hole, a first probe head module with a first through hole set and a plurality of first probe pins, and a second probe head module provided with a plurality of second probe pins. The first probe head module and the second probe head module are respectively arranged on a lower surface and an upper surface of the printed circuit board structure, wherein those first probe pins are set on a periphery of an opening of the first through hole set; and a portion of the second probe head module penetrating the first through hole, the second through hole, and the first through hole set. The first and second probe head module integrated together can be utilized for 3D IC testing.

5 Claims, 8 Drawing Sheets

PROBE CARD STRUCTURE

CROSS-REFERENCE TO RELATED DOCUMENTS

The present invention is a continuation in part (CIP) to a patent application Ser. No. 14/717,240, filed May 20, 2015, now granted, entitled, "Printed circuit board structure", for which priority is claimed under 35 U.S.C. § 120; and this application claims priority of Application No. 103117591 filed in Taiwan on May 20, 2014 under 35 U.S.C. § 119, all disclosures of which are incorporated herein in their entirety herein by reference.

BACKGROUND OF THE INVENTION

1. Field of the Invention

The present invention relates to an IC test device, particularly to a probe card structure probe provided with multiple probe head structures.

2. Description of the Prior Art

In semiconductor fabrication, wafer sort is referred to a technology testing the integrated circuit (IC) on a wafer to guarantee that IC can operate normally and learn the yield of products. Normally, an automatic test equipment (ATE) is temporarily electrically connected with IC on a wafer to verify the performance of IC. A probe card is used to transmit signals between ATE and IC.

Refer to FIG. 1A. In a conventional wafer sort, probes 1100A of a probe card 1000 are interposed between and connected with a printed circuit board structure 2000 and a tested wafer 3000, which are separated from each other by a predefined/fixed probe depth $H_{PD}$. The probe 1100A has a specified diameter-to-length ratio so as to maintain the stiffness of the probe 1100A and favor the connection of the probe 1100A to the printed circuit board structure 2000 and the wafer 3000. With continuous advancement of semiconductor technology, chips are persistently miniaturized to smaller and smaller size. Therefore, it is necessary to reduce the related dimensions of a probe card for wafer sort. Refer to FIG. 1B. The size and spacing of electrodes in the testing area 2100B in the wafer side of the printed circuit board structure 2000 in FIG. 1B are smaller than the size and spacing of electrodes in the testing area 2100A in the wafer side of the printed circuit board structure 2000 in FIG. 1A. Thus, the diameter of the probe 1100A in FIG. 1A must be reduced to the diameter of the probe 1100B in FIG. 1B so as to meet the new situation. In the case that the probe depth $H_{PD}$ and the dimensions of the probe card are unchanged, the diameter-to-length ratio of the probes 1100B must be reduced, which will further reduce the stiffness of the probes 1100B and affect the connection of the probes 1100B to the printed circuit board structure 2000 and the wafer 3000. Thus, the quality and result of wafer sort is also affected. Besides, in the conventional wafer sorting, one probe head is just used for testing one wafer so that the conventional probe head cannot be utilized for 3D IC testing purpose, especially taking die-to-wafer or chip-to-wafer for example.

SUMMARY OF THE INVENTION

One objective of the present invention is to provide a probe card structure, which integrates multiple probe head structures, whereby to test a plurality of 3D IC devices with different height, and wherefore the probe card structure of the present invention can undertake 3D IC testing in high efficiency, high adaptability and high precision.

In one embodiment, the probe card structure of the present invention comprises a printed circuit board structure, a center stiffener, a first probe head module, and a second probe head module. The printed circuit board structure has an upper surface and a lower surface; and a first through hole penetrating the printed circuit board structure. The center stiffener set on the upper surface of the printed circuit board structure; and the center stiffener having a first opening and a second through hole penetrating the first opening. The first probe head module set on the lower surface of the printed circuit board structure and comprising a first through hole set and a plurality of first probe pins, wherein the first through hole, the second through hole, and the first through hole set are aligned vertically; the first probe head module is electrically connected with the printed circuit board structure; and the plurality of first probe pins set on a periphery of an opening of the first through hole set. The second probe head module set on the upper surface of the printed circuit board structure, wherein the second probe head module comprises a plurality of second probe pins; a first portion of the second probe head module lain on the first opening and a second portion of the second probe head module penetrating the first through hole, the second through hole, and the first through hole set; the second probe head module is electrically connected with the printed circuit board structure; and the second probe pins set on the second portion of the second probe head module.

Below, embodiments are described in detail in cooperation with the attached drawings to make easily understood the objectives, technical contents, characteristics and accomplishments of the present invention.

DESCRIPTION OF THE PREFERRED EMBODIMENT

Figure 1A:
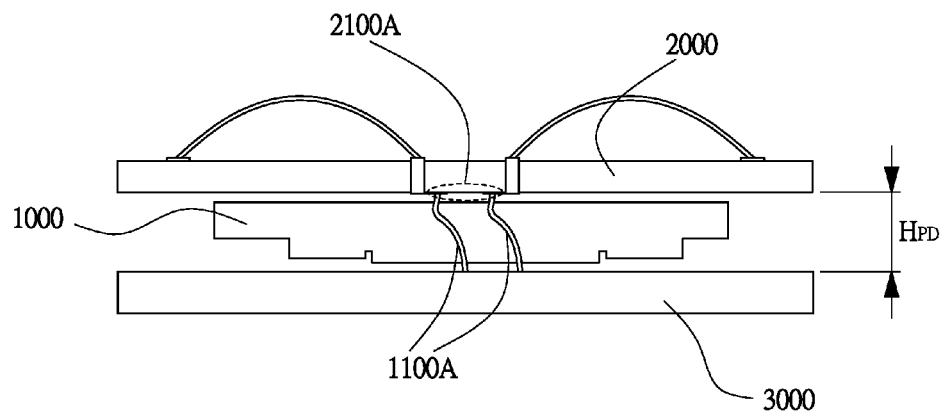
FIG. 1A is a sectional view schematically showing that the probes of a probe card are connected with a printed circuit board structure and a wafer in a conventional wafer sort.
Figure 1B:
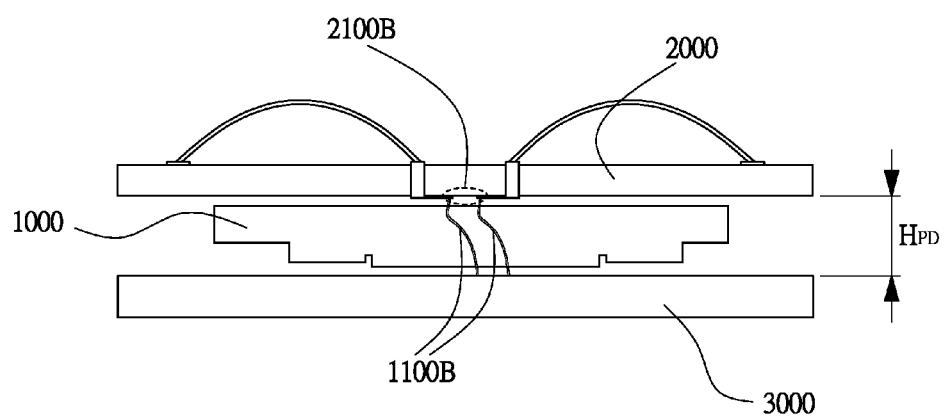
FIG. 1B is a sectional view schematically showing that the probes have a smaller diameter than the probes in FIG. 1A.
Figure 2:
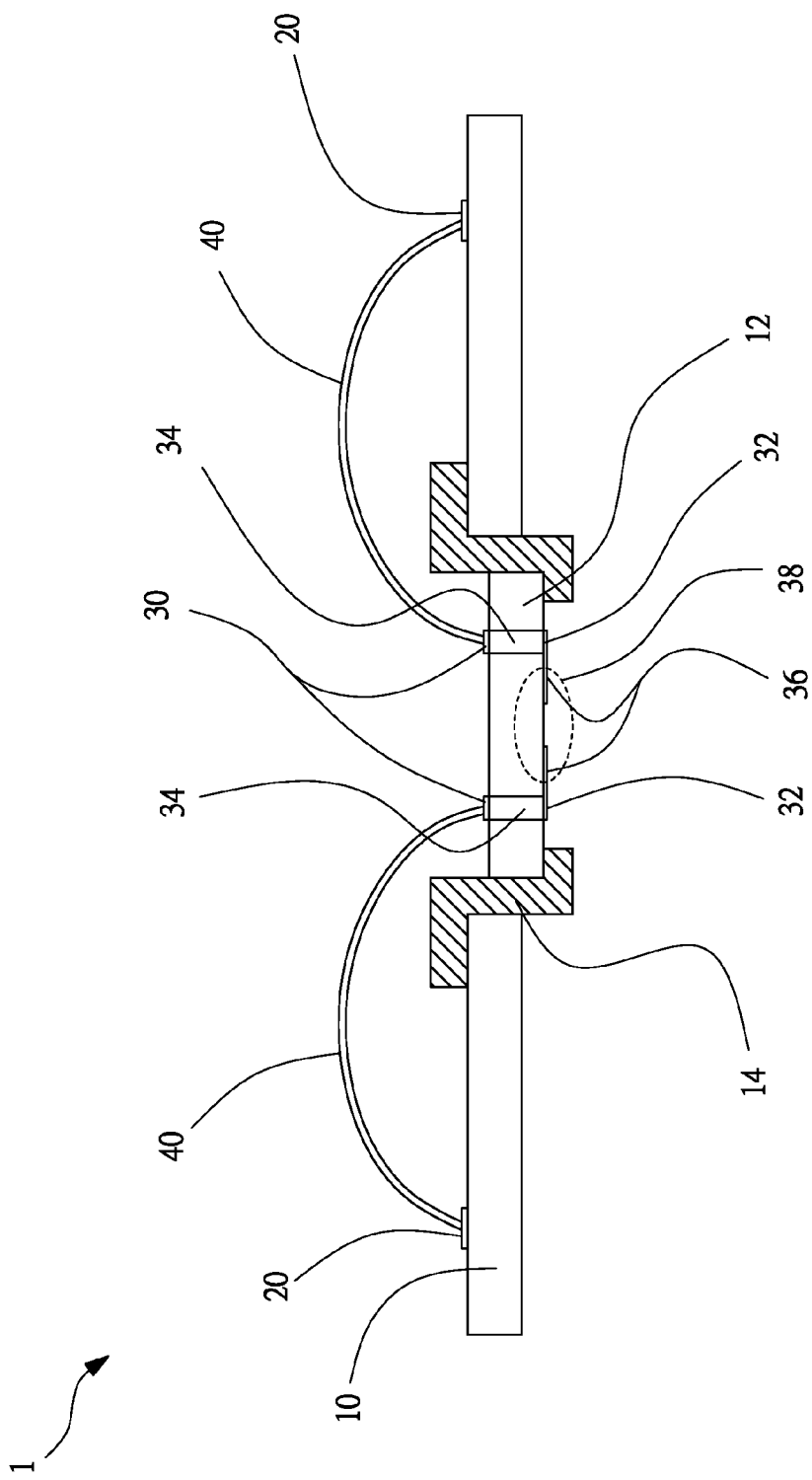
FIG. 2 is a sectional view schematically showing a printed circuit board structure according to one embodiment of the present invention.
Figure 3:
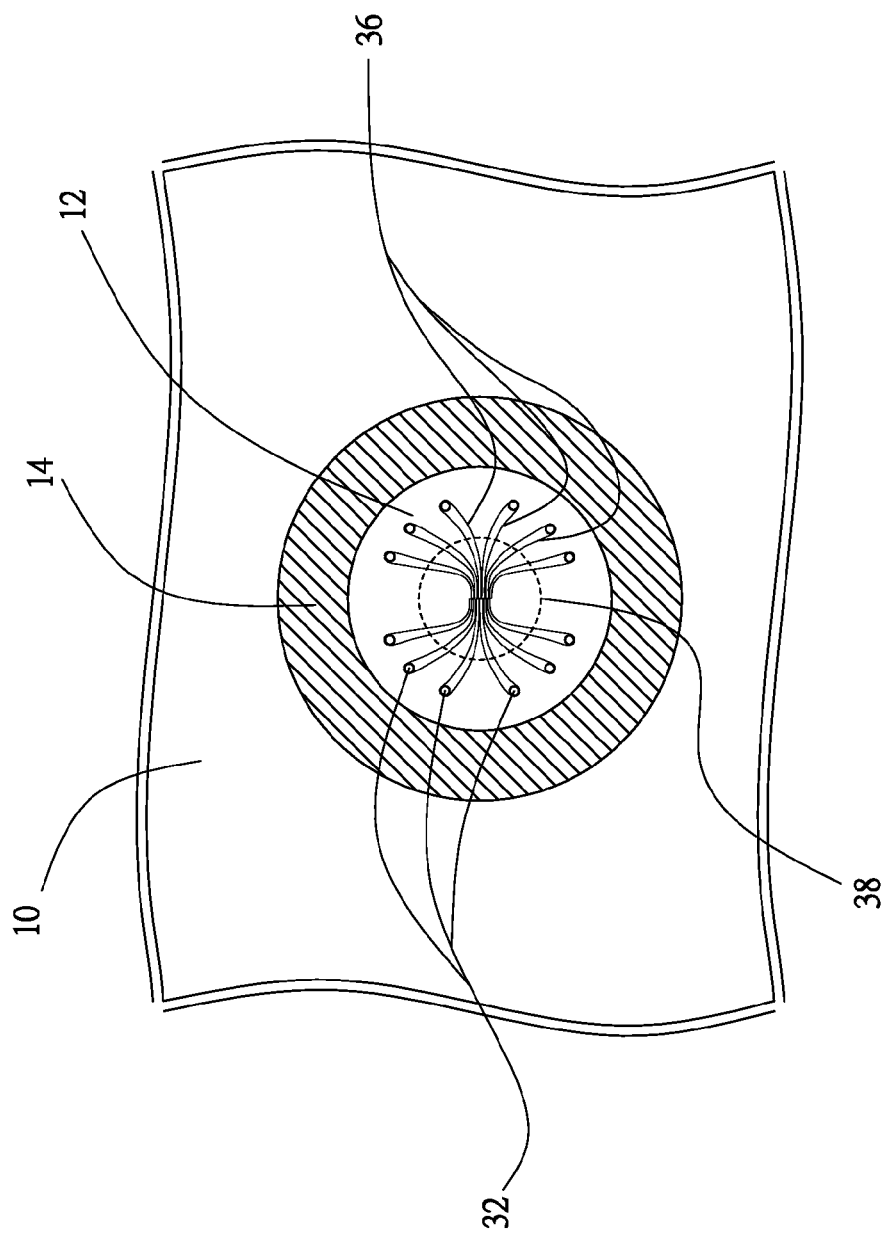
FIG. 3 is a local bottom view schematically showing a printed circuit board structure according to one embodiment of the present invention.

Refer to FIG. 2 a sectional view schematically showing a PCB structure according to one embodiment of the present invention. The PCB structure 1 of the present invention comprises a first body 10, a second body 12 and a sleeve/adapter 14. In substance, the sleeve 14 is a hollow column or hollow disc where a through hole penetrates. The sleeve 14 is disposed between the first body 10 and the second body 12 and separates the first body 10 from the second body 12. In detail, the first body 10 is detachably connected with the outer surface of the sleeve 14 (disposed outside the through hole); the second body 12 is detachably connected with the inner surface of the sleeve 14 (disposed inside the through hole). Preferably, the first body 10 has a plurality of first electrodes 20, and the second body 12 has a plurality of second electrodes 30 respectively corresponding to the first electrodes 20. Preferably, a wire 40 is disposed between each of the first electrodes 20 and the corresponding one of the second electrodes 30, electrically connecting the first electrode 20 with the corresponding second electrode 30. Preferably, each of the second electrodes 30 has a corresponding third electrode 32 disposed on the second body 12. Preferably, a plated through hole 34 is formed between each second electrode 30 and the corresponding third electrode 32, penetrating through the second body 12 and electrically connecting the second electrode 30 and the corresponding third electrode 32. Refer to FIG. 2 again and refer to FIG. 3. Preferably, each of the third electrodes 32 has a signal trace 36; the signal trace 36 gradually shrinks in width and extends to a specified/test area 38 where the signal traces 36 contact probes of a probe card (not shown in the drawing). It should be noted: FIG. 3 is not to limit but only to exemplify the quantities and layout of the third electrodes 32 and the signal traces 36.

In one embodiment, the second body 12 has at least one electric barrier (not shown in the drawing) disposed between each two adjacent signal traces 36, especially among the rear ends of at least two signal traces 36. The electric barrier has a higher insulation coefficient, such as an insulation coefficient equal to or higher than the insulation coefficient of air, so as to reduce the probability of current leakage between two adjacent signal traces 36. Preferably, the electric barrier is in form of at least one of slots, holes and structures made of an insulating material; the slots are through slots or blind slots; the holes are through holes or blind holes; the insulating material has an insulation coefficient higher than the insulation coefficient of air.

Figure 4:
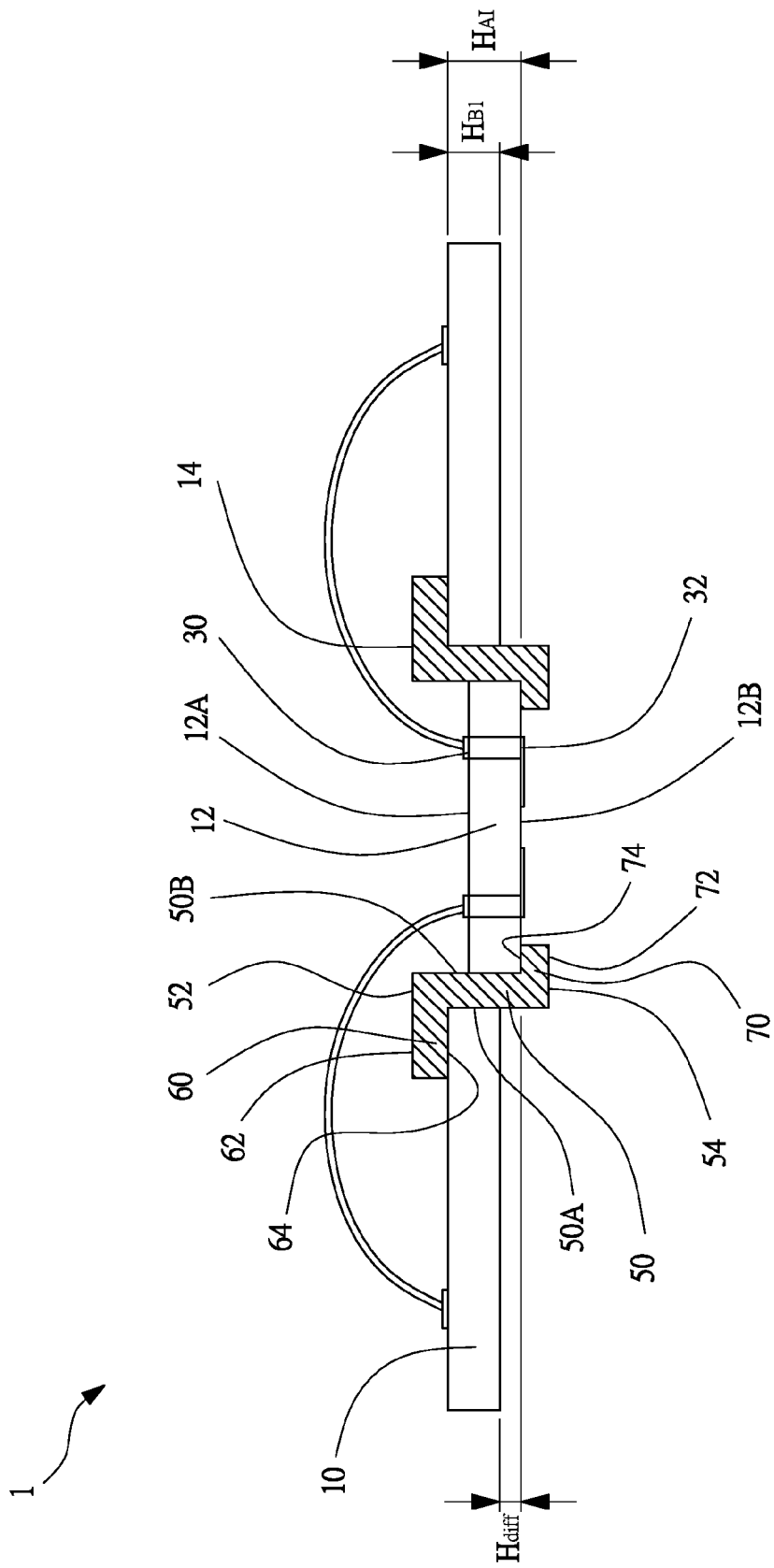
FIG. 4 is a sectional view where numerals are assigned to the components of the sleeve shown in FIG. 2 and characteristic dimensions are defined.

Refer to FIG. 4 for the detailed structure of the sleeve 14. The sleeve 14 includes a wall 50, a first protrusion 60 and a second protrusion 70. The wall 50 extends axially, having an outer wall surface 50A and an inner wall surface 50B in the radial direction and having a first wall end 52 and a second wall end 54 opposite the first wall end 52 in the axial direction. The first protrusion 60 extends outward radially from the first wall end 52 and defines a first outer side 62 and a first inner side 64 opposite the first outer side 62 in the axial direction. The second protrusion 70 extends inward radially from the second wall end 54 and defines a second outer side 72 and a second inner side 74 opposite the second outer side 72 in the axial direction. The first body 10 is disposed in the outer wall surface 50A of the sleeve 14. Preferably, the first body 10 is detachably connected with the first protrusion 60 of the sleeve 14. In one embodiment, the first body 10 is detachably connected with the first inner side 64 of the first protrusion 60 of the sleeve 14. The second body 12 is disposed in the inner wall surface 50B of the sleeve 14. Preferably, the second body 12 is detachably connected with the second protrusion 70 of the sleeve 14. In one embodiment, the second body 12 is detachably connected with the second inner side 74 of the second protrusion 70 of the sleeve 14. The abovementioned structure defines a sleeve inner side height $H_{AI}$ between the first inner side 64 and the second inner side 74, which is greater than the first body thickness $H_{B1}$ of the first body 10. Thus, a differential height $H_{diff}$ exists between the second inner side 74 and one side of the first body 10, which is near the second inner side 74. In other words, the differential height $H_{diff}$ exists between one side of the second body 12, which contacts the second inner side 74, and one side of the first body 10, which is near the second inner side 74. The configuration of the second electrodes 30 and the third electrodes 32 in the second body 12 is further described in detail below. The second electrodes 30 are disposed on one side 12A of the second body 12, which is far away from the second protrusion 70. The third electrodes 32 are disposed on another side 12B of the second body 12, which is near the second protrusion 70, and correspond to the second electrodes 30.

Figure 5:
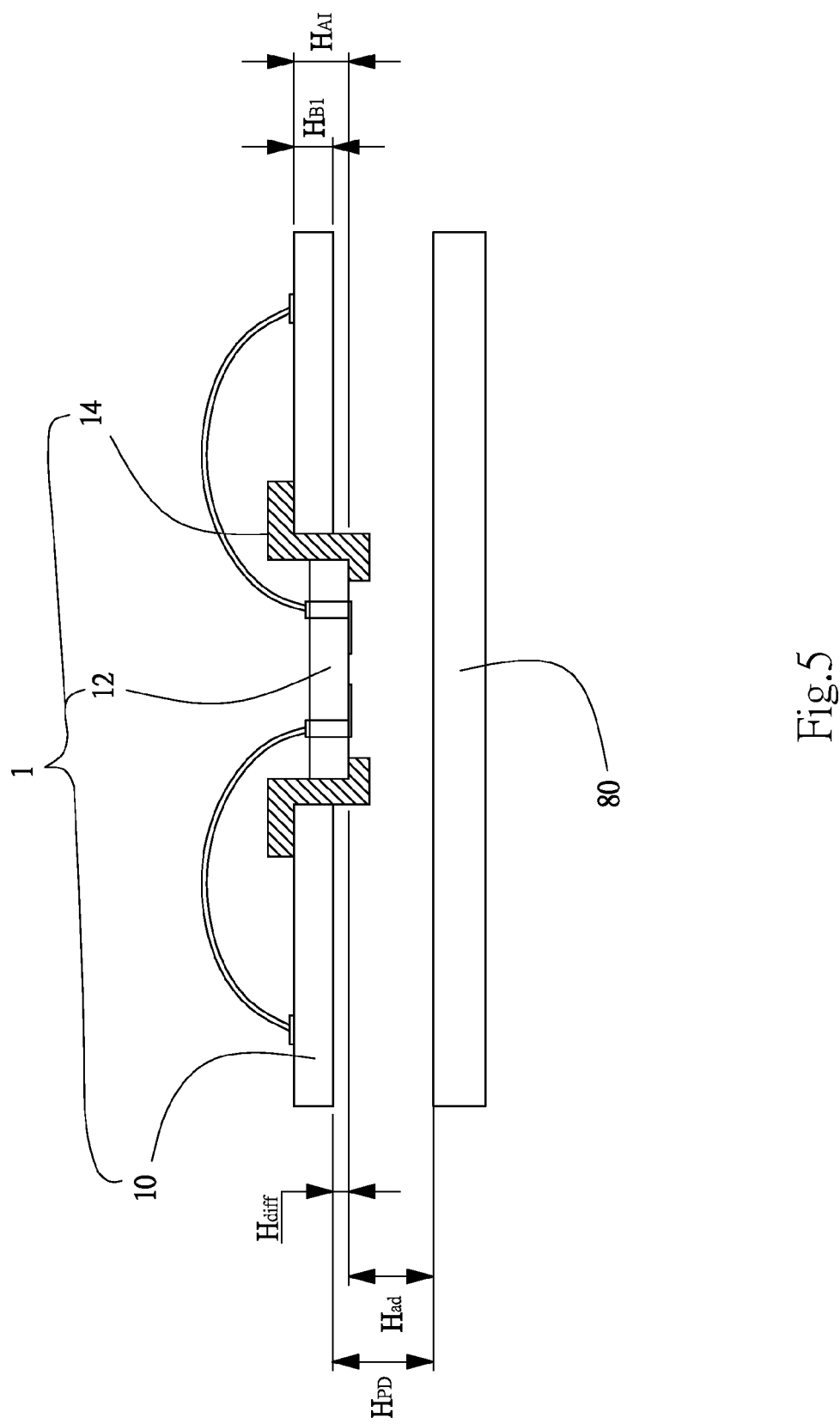
FIG. 5 is a sectional view schematically showing the configuration of a printed circuit board structure and a tested wafer/semiconductor device according to one embodiment of the present invention.

Refer to FIG. 5 a diagram schematically showing the configuration of a PCB structure and a tested wafer/semiconductor device according to one embodiment of the present invention. The PCB structure 1 is disposed over a wafer 80 for wafer sort. The differential height $H_{diff}$ of the sleeve inner side height $H_{AI}$ and the first body thickness $H_{B1}$ makes the adjustment height $H_{ad}$, which is defined by the second body 12 and the wafer 80, smaller than a predefined probe depth $H_{PD}$, which is defined by the first body 10 and the wafer 80. While chip miniaturization demands that the diameter of the probes should be reduced, the distance between the second body 12 and the wafer 80 that are connected by the probes of the probe card (not shown in the drawing), especially the probe length at which the probes connect the second body 12 and the wafer 80, can be reduced without varying the predefined grip length/predefined probe depth $H_{PD}$ between the PCB structure 1 (especially the first body 10) and the wafer 80 because of the abovementioned configuration. Thereby, the diameter-to-length ratio of the probes exposed from the probe card can be maintained within a specified range.

Figure 6:
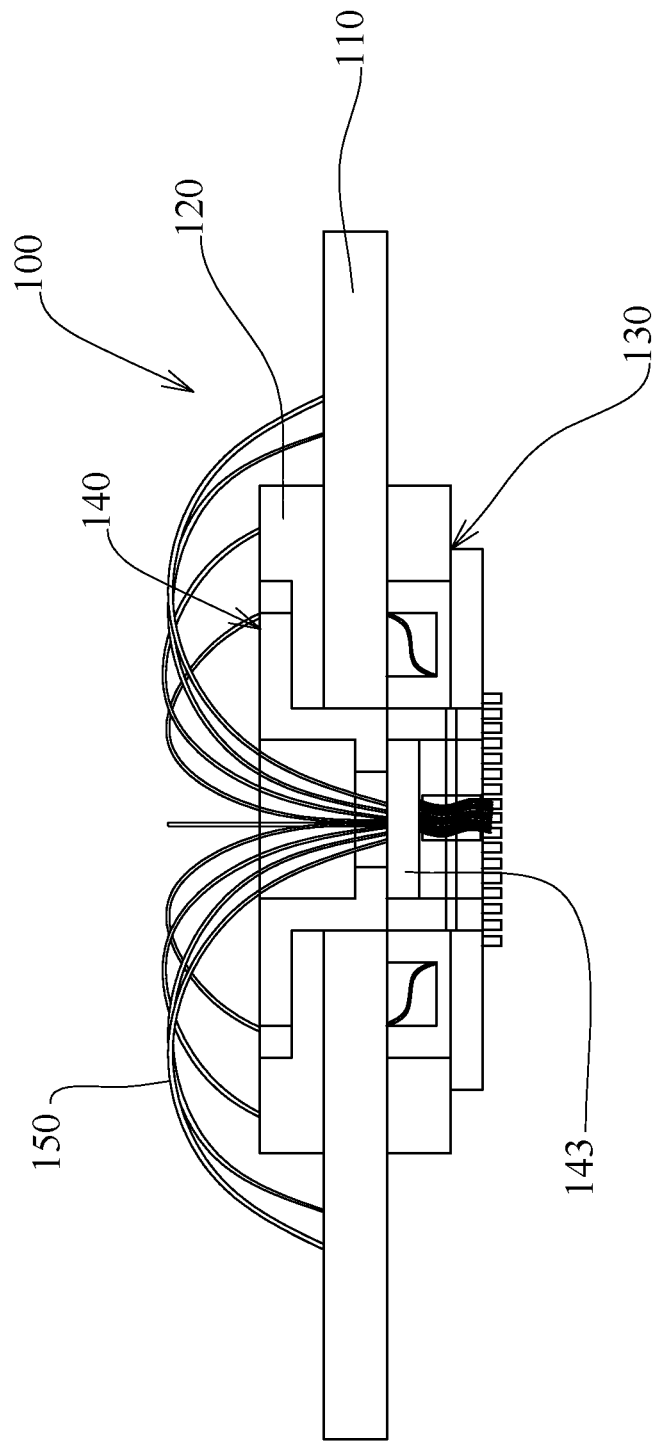
FIG. 6 is a sectional view schematically showing a probe card structure according to one embodiment of the present invention.
Figure 7:
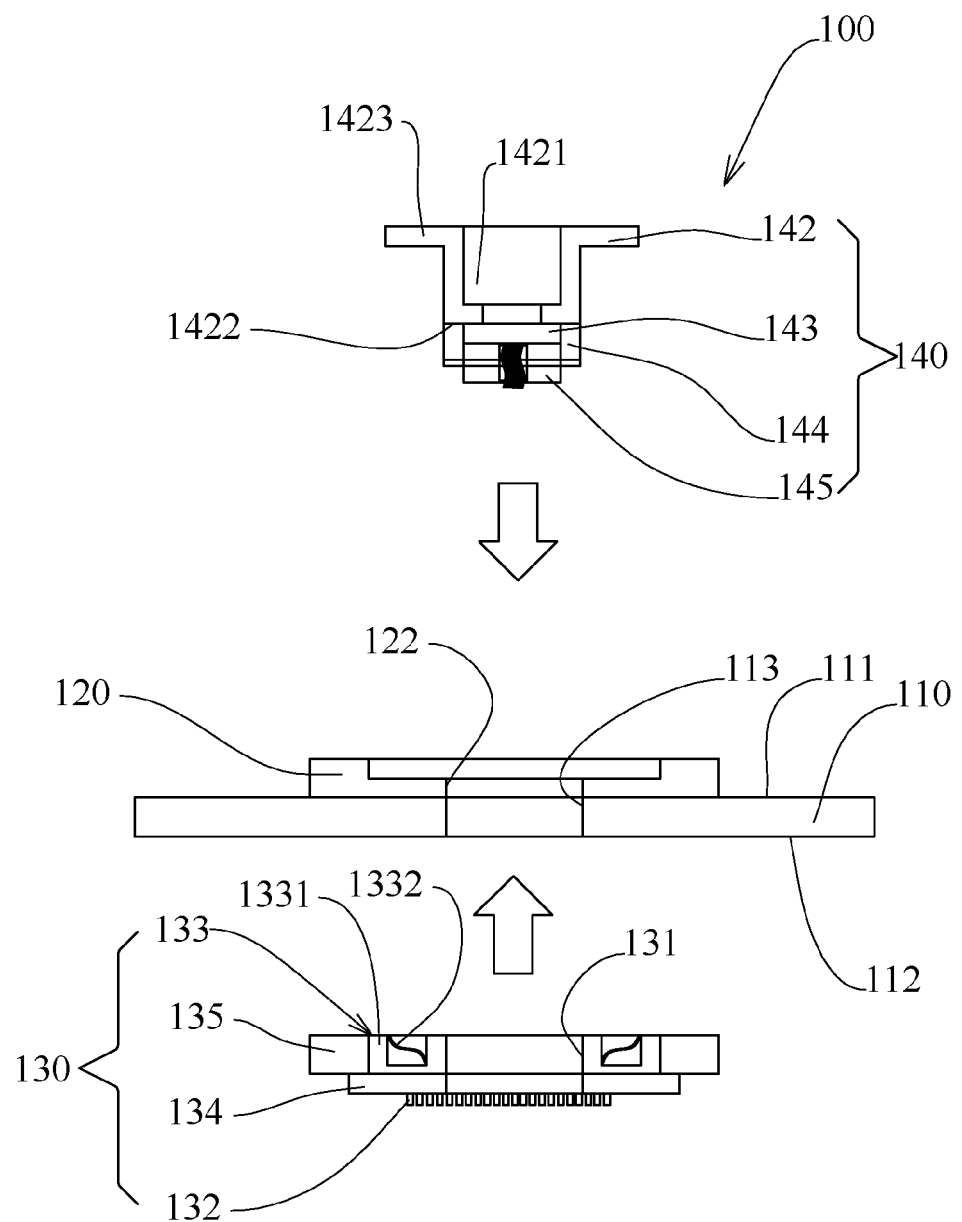
FIG. 7 illustrating an assembling drawing schematically showing a probe card structure according to one embodiment of the present invention.

In one embodiment, referring to FIGS. 6 and 7, FIG. 6 illustrating a sectional view schematically showing a probe card structure according to one embodiment of the present invention; and FIG. 7 illustrating an assembling drawing schematically showing a probe card structure according to one embodiment of the present invention. As shown in the figure, the probe card structure 100 of the present invention comprises a printed circuit board structure 110, a center stiffener 120, a first probe head module 130, and a second probe head module 140. The printed circuit board structure 110 has an upper surface 111 and a lower surface 112; and a first through hole 113 penetrating the printed circuit board structure 110 from the upper surface 111 to the lower surface 112. The center stiffener 120 set on the upper surface 111 of the printed circuit board structure 110; and the center stiffener 120 having a first opening 121 and a second through hole 122 penetrating the first opening 121. The first probe head module 130 set on the lower surface 112 of the printed circuit board structure 110 and comprising a first through hole set 131 and a plurality of first probe pins 132, wherein the first through hole 113, the second through hole 122, and the first through hole set 131 are aligned vertically; the first probe head module 130 is electrically connected with the printed circuit board structure 110; and the plurality of first probe pins 132 set on a periphery of an opening of the first through hole set 131. The second probe head module set on the upper surface of the printed circuit board structure, wherein the second probe head module 140 comprises a plurality of second probe pins 141; a first portion of the second probe head module 140 lain on the first opening and a second portion of the second probe head module 140 penetrating the first through hole 113, the second through hole 122, and the first through hole set 131; the second probe head module 140 is electrically connected with the printed circuit board structure 110; and the second probe pins 141 set on the second portion of the second probe head module 140. In one embodiment, the needle tips of the first probe pins 132 and the needle tips of the second probe pins 141 are non-coplanar so that the probe card structure 100 can be utilized to test a plurality of 3D IC devices with different height.

Figure 8A:
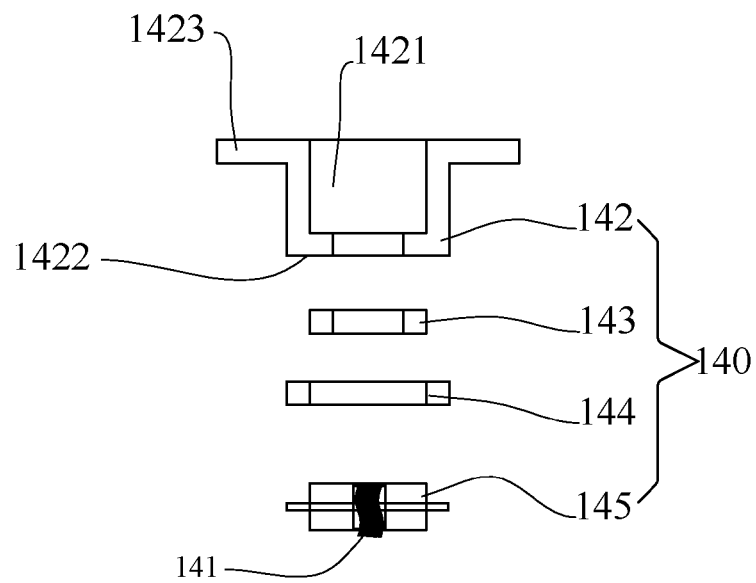
FIG. 8A illustrating an exploded drawing schematically showing a second probe head module according to one embodiment of the present invention.
Figure 8B:
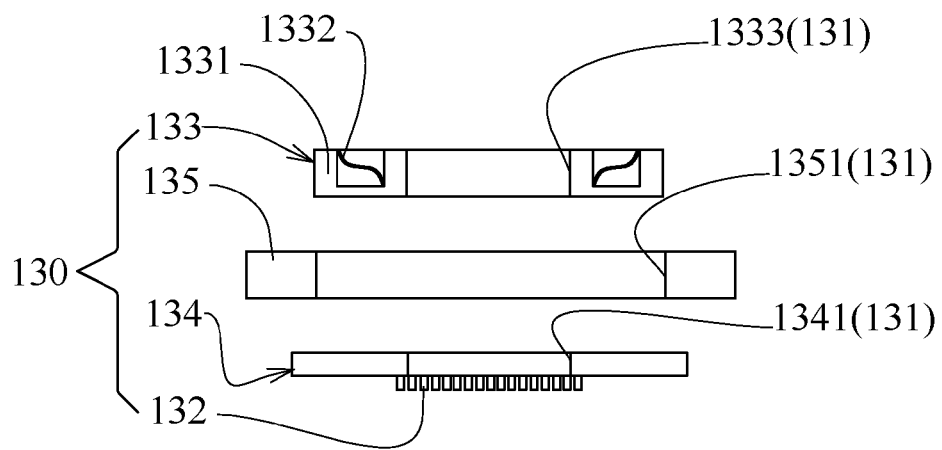
FIG. 8B illustrating an exploded drawing schematically showing a first probe head module according to one embodiment of the present invention.

In one embodiment, referring to FIG. 7 and FIG. 8B, the first probe head module 130 comprises a first substrate 133, a first probe head structure 134, a first mounting ring 135; the first substrate 133 and the mounting ring 135 set on the lower surface 112 of the printed circuit board structure 110; the first probe head structure 134 set under the first substrate 133 and fixed on the first mounting ring 135 and the first probe head structure 134 comprises the first probe pins 132 and electrically connected to the first substrate 133; and the first substrate 133 is electrically connected to the printed circuit board structure 110. Further, as shown in FIG. 8B, the first through hole set 131 comprises a plurality of sub through hole 1333, 1341, 1351, wherein the first probe pins 132 are set on a periphery of an opening of the sub through hole 1341.

Next, in one embodiment, referring to FIG. 7 and FIG. 8B, the first substrate 133 comprises: a main body 1331 being plate-shaped and having a hollowed interior, wherein a plurality of upper contacts and upper openings are arranged on an upper surface of the main body; and a plurality of wires 1332, wherein two ends of each the wire 1332 respectively pass through a main body 1331, the wires 1332 are mutually electrically insulated, and each the wire 1332 protrudes from one the upper opening and is electrically connected with one of the upper contacts adjacent to the upper opening.

In one embodiment, referring to FIG. 6, FIG. 7 and FIG. 8A, the second probe head module 140 comprises: a sleeve 142 having a hollow cylindrical main body 1421 with a bottom 1422, and a annular protrusion 1423 extending outward radially from one end of the cylindrical main body 1421 and the annular protrusion 1423 lain on the first opening of the center stiffener; a second substrate 143 set under the bottom 1422 of the sleeve 142; a second mounting ring 144 fixed on the bottom 1422 of the sleeve 142 and surrounding the second substrate 143; and a second probe head structure 145 fixed on the second mounting ring 144 and electrically connected to the second substrate 143, wherein the second substrate 143 is electrically connected to the printed circuit board structure 110. In one embodiment, a plurality of wiring cables 150 penetrating through the hollow cylindrical main body 1421 electrically connect to the second substrate 143 and the printed circuit board structure 110.

In conclusion, the probe card structure of the present invention integrates multiple probe head structures to enable the 3D IC testing can be undertaken in high efficiency, high adaptability and high precision.

Although the present invention has been explained in relation to its preferred embodiment, it is to be understood that other modifications and variation can be made without departing the spirit and scope of the invention as hereafter claimed.

What is claimed is:

1. A probe card structure comprising:
    a printed circuit board structure, having an upper surface and a lower surface; and a first through hole penetrating said printed circuit board structure;
    a center stiffener set on said upper surface of said printed circuit board structure; and said center stiffener having a first opening and a second through hole penetrating said first opening;
    a first probe head module set on said lower surface of said printed circuit board structure and comprising a first through hole set and a plurality of first probe pins, wherein said first through hole, said second through hole, and said first through hole set are aligned vertically; said first probe head module is electrically connected with said printed circuit board structure; and said plurality of first probe pins set on a periphery of an opening of said first through hole set; and
    a second probe head module set on said upper surface of said printed circuit board structure, wherein said second probe head module comprises a plurality of second probe pins; a first portion of said second probe head module lain on said first opening and a second portion of said second probe head module penetrating said first through hole, said second through hole, and said first through hole set; said second probe head module is electrically connected with said printed circuit board structure; and said second probe pins set on said second portion of said second probe head module, wherein said second probe head module comprises:
    a sleeve having a hollow cylindrical main body with a bottom, and an annular protrusion extending outward radially from one end of said hollow cylindrical main body and said annular protrusion lain on said first opening of said center stiffener;
    a second substrate set under said bottom of said sleeve;
    a second mounting ring fixed on said bottom of said sleeve and surrounding said second substrate; and
    a second probe head structure fixed on said second mounting ring and electrically connected to said second substrate, wherein said second substrate is electrically connected to said printed circuit board structure.

2. The probe card structure according to claim 1, wherein said first probe head module comprises a first substrate, a first probe head structure, a first mounting ring; said first substrate and said mounting ring set on said lower surface of said printed circuit board structure; said first probe head structure set under said first substrate and fixed on said first mounting ring and said first probe head structure comprises said first probe pins and electrically connected to said first substrate; and said first substrate is electrically connected to said printed circuit board structure.

3. The probe card structure according to claim 2, wherein said first substrate comprises:
    a main body being plate-shaped and having a hollowed interior, wherein a plurality of upper contacts and upper openings are arranged on an upper surface of said main body; and
    a plurality of wires, wherein two ends of each said wire respectively pass through said main body, said wires are mutually electrically insulated, and each said wire protrudes from one said upper opening and is electrically connected with one of said upper contacts adjacent to said upper opening.

4. The probe card structure according to claim 1, wherein a plurality of wiring cables penetrating through said hollow cylindrical main body electrically connect with said second substrate and said printed circuit board structure.

5. The probe card structure according to claim 1, wherein needle tips of said first probe pins and needle tips of said second probe pins are non-coplanar.

* * * * *